United States Patent
Blazer et al.

(10) Patent No.: US 11,005,465 B1
(45) Date of Patent: May 11, 2021

(54) ZERO-CROSS CIRCUIT WITH LOW PHASE DELAY

(71) Applicant: Hamilton Sundstrand Corporation, Charlotte, NC (US)

(72) Inventors: Christopher Blazer, Machesney Park, IL (US); Richard T. Wetzel, Davis Junction, IL (US); David L. Heck, Roscoe, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/741,033

(22) Filed: Jan. 13, 2020

(51) Int. Cl.
  *H03K 5/153* (2006.01)
  *H03K 5/1536* (2006.01)
  *H03K 5/24* (2006.01)

(52) U.S. Cl.
  CPC .......... *H03K 5/1536* (2013.01); *H03K 5/24* (2013.01)

(58) Field of Classification Search
  CPC ........ H03K 5/08; H03K 5/2481; H03K 5/249; H03K 5/153; H03K 5/1534; H03K 5/1536; H03K 17/13; G01R 19/175; H02M 1/083
  See application file for complete search history.

(56) References Cited

U.S. PATENT DOCUMENTS

| | | |
|---|---|---|
| 7,049,859 B2 | 5/2006 | Boyer et al. |
| 9,787,360 B2 | 10/2017 | Braunshtein et al. |
| 2017/0277211 A1* | 9/2017 | Li ............................ H03K 5/08 |
| 2019/0171242 A1* | 6/2019 | Li ............................ H03K 5/08 |

FOREIGN PATENT DOCUMENTS

CN 204964613 U 1/2016

* cited by examiner

*Primary Examiner* — Long Nguyen
(74) *Attorney, Agent, or Firm* — Cantor Colburn LLP

(57) ABSTRACT

Provided are embodiments for a system including a zero-cross circuit. The system includes a first channel and a second channel Each channel includes a generator, a generator relay, and a bus tie relay. In addition, the system includes a zero-cross circuit, wherein the zero-cross circuit synchronizes the operation of the first and second channel, and at least one controller configured to control the operation of the first channel and the second channel based on an input from the zero-cross circuit. Also provided is a method for operating the zero-cross circuit with low phase delay. The method includes receiving an inverting input, receiving a non-inverting input, and comparing the inverting input and the non-inverting input. The method also includes receiving feedback from an output of the comparator; and outputting a waveform based on the comparison of the inverting input and the non-inverting input and the feedback.

9 Claims, 4 Drawing Sheets

ZERO-CROSS CIRCUIT WITH LOW PHASE DELAY

BACKGROUND

The present invention generally relates to electrical circuits, and more specifically, to a zero-cross circuit with low phase delay.

A zero-cross circuit is a circuit that can detect the transition of a waveform from the positive portion to the negative portion of the waveform. In various circuits, a phase lag/delay can be added due to hysteresis. Hysteresis occurs as the changes in the output lags behind the changes in the input causing the change in the output. For example, the output of magnetic induction lags behind the input of the magnetizing force. This can create problems in parallel alternating current (AC) systems, such as that of an aircraft because frequency sensing is required to be in phase.

BRIEF DESCRIPTION

According to an embodiment, a zero-cross circuit with low phase delay is provided. The circuit includes a comparator having an inverting input operable to receive a reference signal; a non-inverting input operable to receive an alternating current (AC) signal; and a feedback loop operable to couple an output of the circuit to the comparator.

In addition to one or more of the features described herein, or as an alternative, further embodiments include a feedback loop that is coupled to the non-inverting input of the comparator.

In addition to one or more of the features described herein, or as an alternative, further embodiments include a feedback loop that includes a capacitor in series with a resistor, wherein the capacitor reduces a phase delay for the circuit.

In addition to one or more of the features described herein, or as an alternative, further embodiments include a capacitor that functions as a "speed-up" capacitor.

In addition to one or more of the features described herein, or as an alternative, further embodiments include a combination of a capacitor in series with the resistor is in parallel with another resistor.

According to an embodiment, a system including a zero-cross circuit with low phase delay is provided. The system includes a first channel having a first generator; a first generator relay; and a first bus tie relay. The second channel includes a second generator; a second generator relay; and a second bus tie relay. The system also includes a zero-cross circuit, wherein the zero-cross circuit synchronizes the operation of the first channel and the second channel; and a controller configured to control the operation of the first channel and the second channel based on an input from the zero-cross circuit.

In addition to one or more of the features described herein, or as an alternative, further embodiments include a zero-cross circuit that is configured to receive an inverting input; receive a non-inverting input; compare the inverting input and the non-inverting input; receive feedback from an output of the comparator; and output a waveform based on the comparison of the inverting input and the non-inverting input and the feedback.

In addition to one or more of the features described herein, or as an alternative, further embodiments include using a non-inverting input that is an AC signal.

In addition to one or more of the features described herein, or as an alternative, further embodiments include using an inverting input that is a reference signal.

In addition to one or more of the features described herein, or as an alternative, further embodiments include a zero-cross circuit that is configured to add a voltage of a capacitor at a zero-cross level of the signal at a positive portion of the signal.

In addition to one or more of the features described herein, or as an alternative, further embodiments include a zero-cross circuit that is configured to remove the voltage of the capacitor at a zero-cross level of the signal at a negative portion of the signal.

In addition to one or more of the features described herein, or as an alternative, further embodiments include a zero-cross circuit that is configured to set a level of the reference signal at a zero-cross level of the signal.

According to an embodiment, a method for operating the zero-cross circuit with low phase delay is provided. The method comprises receiving, at a comparator, an inverting input; receiving, at the comparator, a non-inverting input; comparing, at the comparator, the inverting input and the non-inverting input; receiving feedback from an output of the comparator; and outputting a waveform based on the comparison of the inverting input and the non-inverting input and the feedback.

In addition to one or more of the features described herein, or as an alternative, further embodiments include using a non-inverting input that is an AC signal.

In addition to one or more of the features described herein, or as an alternative, further embodiments include using an inverting input that is a reference signal.

In addition to one or more of the features described herein, or as an alternative, further embodiments include adding a voltage of a capacitor at a zero-cross level of the signal at a positive portion of the signal.

In addition to one or more of the features described herein, or as an alternative, further embodiments include removing the voltage of the capacitor at a zero-cross level of the signal at a negative portion of the signal.

In addition to one or more of the features described herein, or as an alternative, further embodiments include setting a level of the reference signal at a zero-cross level of the signal.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Zero-cross circuits can be implemented to synchronize two or more systems such as power generating systems. The zero-cross detector is used to identify the point where the waveform crosses the zero-cross voltage level of the signal being monitored. This can be used to generate timing signals for controlling an AC switch or relay for connecting/switching the multiple power generating systems. This reduces the distortion of the output signal and provides less stress on the switching device. The reduction in the heat generated during operation of the circuit and can increase the reliability of the circuitry. By coupling the systems during the zero-cross levels less heat is generated in the system.

Conventional systems have a phase lag/delay and apply the hysteresis to a known reference signal. The techniques described herein apply the hysteresis to the actual signal itself and provides positive feedback. This reduces the delay to almost a zero-phase delay and improves the oscillation at the reference level due to glitching or double clocking of the output.

The techniques described herein minimize the error from a first system to a second system, and operating the first and second system in parallel for a period of time. The techniques described herein provide a zero-cross circuit with low phase delay that uses positive feedback (on the signal being measured) along with a speed-up capacitor in the feedback loop.

Figure 1:
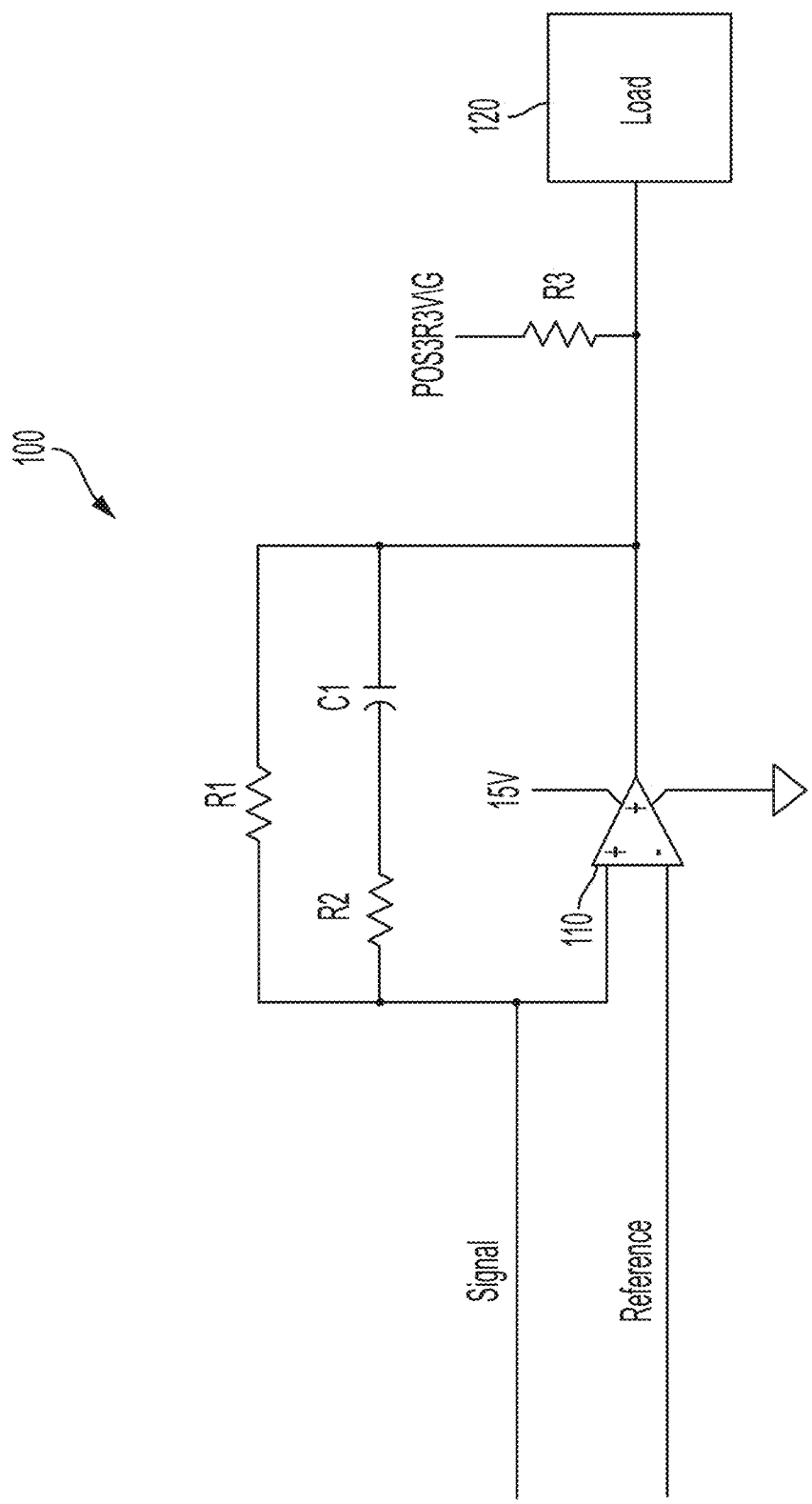
FIG. 1 depicts a zero-cross circuit with low phase delay in accordance with one or more embodiments.

Now referring to FIG. 1, a zero-cross circuit 100 with low phase delay in accordance with one or more embodiments is shown. The circuit 100 includes a comparator 110. The comparator 110 includes a non-inverting input and an inverting input. The non-inverting input of the comparator 110 receives a signal from a source (not shown). In an embodiment, the signal is an alternating current (AC) signal such as a sin wave. The inverting input of the comparator 110 receives a reference signal from a reference source (not shown). In one or more embodiments, a resistor network (not shown) can be used to set the reference voltage for the inverting input.

The comparator 110 compares the inverting input and the non-inverting input to determine an output of the comparator 110. The output of the comparator 110 outputs a logic high voltage or a logic low voltage based on the comparison. The output of the circuit 100 can be coupled to a load 120.

FIG. 1 also includes a feedback network (resistor R1, R2, capacitor C1). The resistor R2 and capacitor C1 are in series, and the combination of the resistor R2 and capacitor C1 are in parallel with the resistor R1 of the feedback network. The capacitor C1 functions as a "speed-up" capacitor to reduce the phase lag/delay from the hysteresis of the circuit 100.

Figure 2:
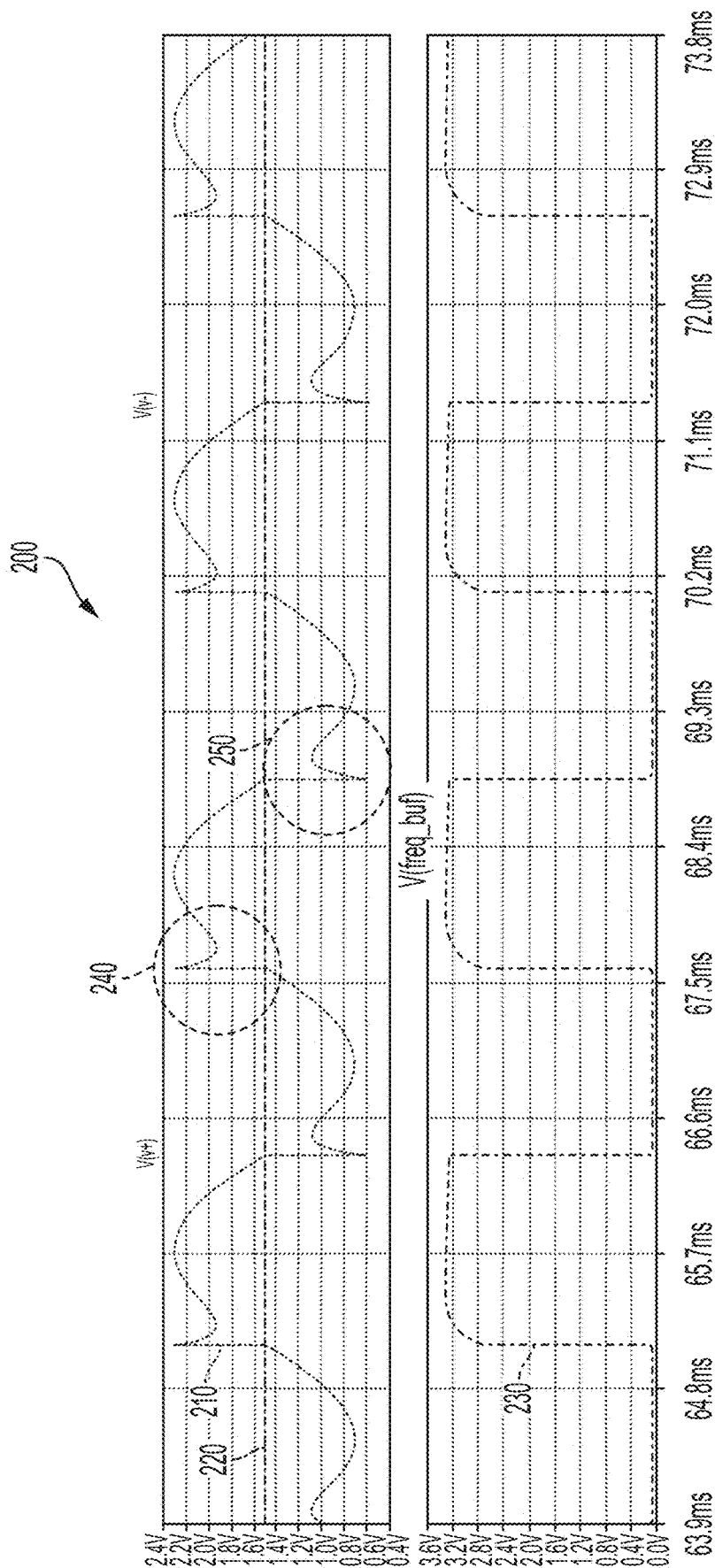
FIG. 2 depicts a waveform of the operation of the zero-cross circuit with low phase delay in accordance with one or more embodiments.

FIG. 2 depicts a waveform for the operation of the zero-cross circuit 100 in accordance with one or more embodiments. The x-axis of the waveform represents time, and the y-axis of the waveform represents a voltage level. The comparator 110 is operated to generate an output waveform 230 that is high when the input signal is positive (greater than the reference voltage) and low when the input signal is negative (less than the reference voltage). The zero-crossings can be used for timing the connection of multiple power systems or other applications where timing is important.

The signal waveform 210 represents a signal such as an alternating current from a generator or other source, and the reference waveform 220 represents a "reference" signal. In one or more embodiments, the reference level can be configured using a voltage divider circuit or other configurations. The output waveform 230 from the comparator 110 produces a high signal when the signal is larger than the reference signal. The comparator 110 produces a low signal when the signal is smaller than the reference signal.

The signal waveform 210 shows an area of interest 240. A spike is produced when the signal transition from the negative to the positive portion of the waveform. The spike is equal to the voltage of the capacitor C1 in the feedback loop. The waveform 210 also provides an area of interest 250. The voltage is removed from the signal when it transitions from the positive to the negative portion of the waveform. The voltage is equal to the capacitor C1 in the feedback loop.

This effect is achieved using the capacitor C1 in the feedback network of the circuit 100. This capacitor C1 operates as a "speed-up" capacitor to reduce the lag/phase delay from the hysteresis. This ensures that there is no doubling clocking or glitching around the reference voltage level due to distortion or other unwanted effects. This produces a spike at the zero-cross line to ensure the output of the comparator produces a logic high signal without unwanted oscillation around the voltage level.

Similarly, when the signal transitions to the negative portion of the signal that is less than the reference signal, the voltage of the capacitor C1 is removed resulting in a drop in voltage approximately equal to the voltage of the capacitor C1. This voltage drop is produced in the negative direction, which also ensures there is no oscillation at the zero-cross level. The output of the comparator 110 provides a logic low signal.

Figure 3:
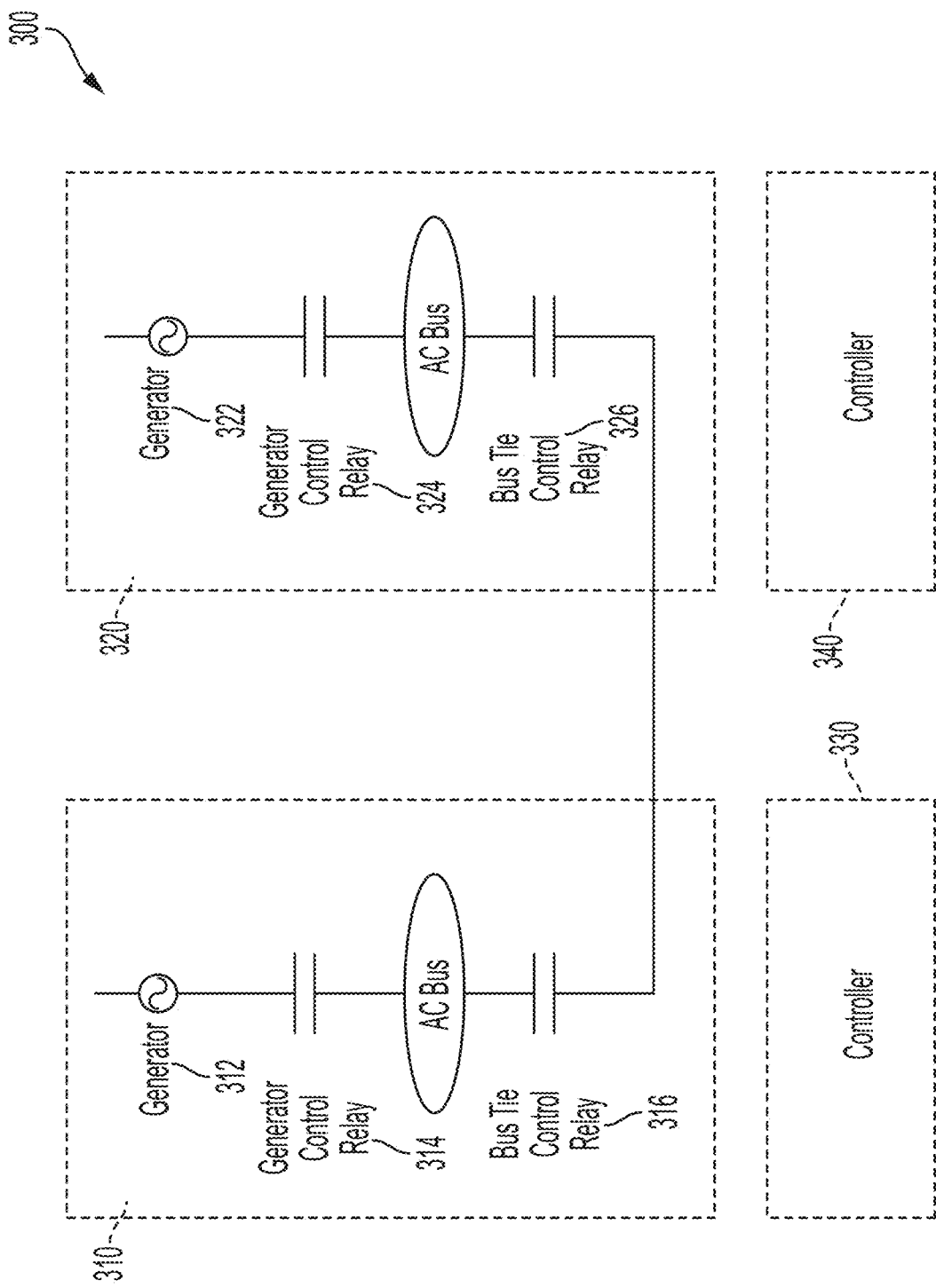
FIG. 3 depicts a system that includes a zero-cross circuit with low phase delay in accordance with one or more embodiments.

Referring now to FIG. 3, a block diagram of an aircraft power system 300 is shown. FIG. 3 shows a first channel 310 including a first generator 312, a first generator control relay 314, and a bus tie control relay 316. FIG. 3 also shown a second channel 320 including a second generator 322, a second generator control relay 324, and a second bus tie control relay 326. Also, shown in FIG. 3 are controllers 330, 340 that are configured to provide control signals to generators 312, 322, the generator control relays 314, 324, and the bus tie control relays 316, 326. As illustrated, the controller 330 is configured to control the first channel 310, and the controller 340 is configured to control the second channel 320. In a non-limiting example, the system 300 can be implemented in aircraft having two or more engines. Each respective engine operates its respective generator which can be controlled by a generator control unit (GCU). The circuit of FIG. 1 can be implemented into the system 300 to synchronize the operation of the two or more power generating channels.

The system 300 can be configured in a parallel or non-parallel power system. In a non-parallel system that utilizes a "No Break Power Transfer" technique, the two generating channels are brought into parallel, using the Bus Tie Control relays 316, 326, long enough to transfer one of the AC buses from one generator source to the other source. In a parallel system, after both generators are synchronized for both output frequency and phase, both Bus Tie Control relays 316, 326 remain closed unless there was a reason to isolate them.

In the event of a generator failure, the bus tie control relays 316, 326 allow the operating generator to power both buses, so that no electrical systems are lost and remains functional. In one or more embodiments, the bus tie relays 316, 326 can be manually operated. In other embodiments, the bus tie relays 316, 326 can be automatically controlled by a connected logic system (not shown).

Figure 4:
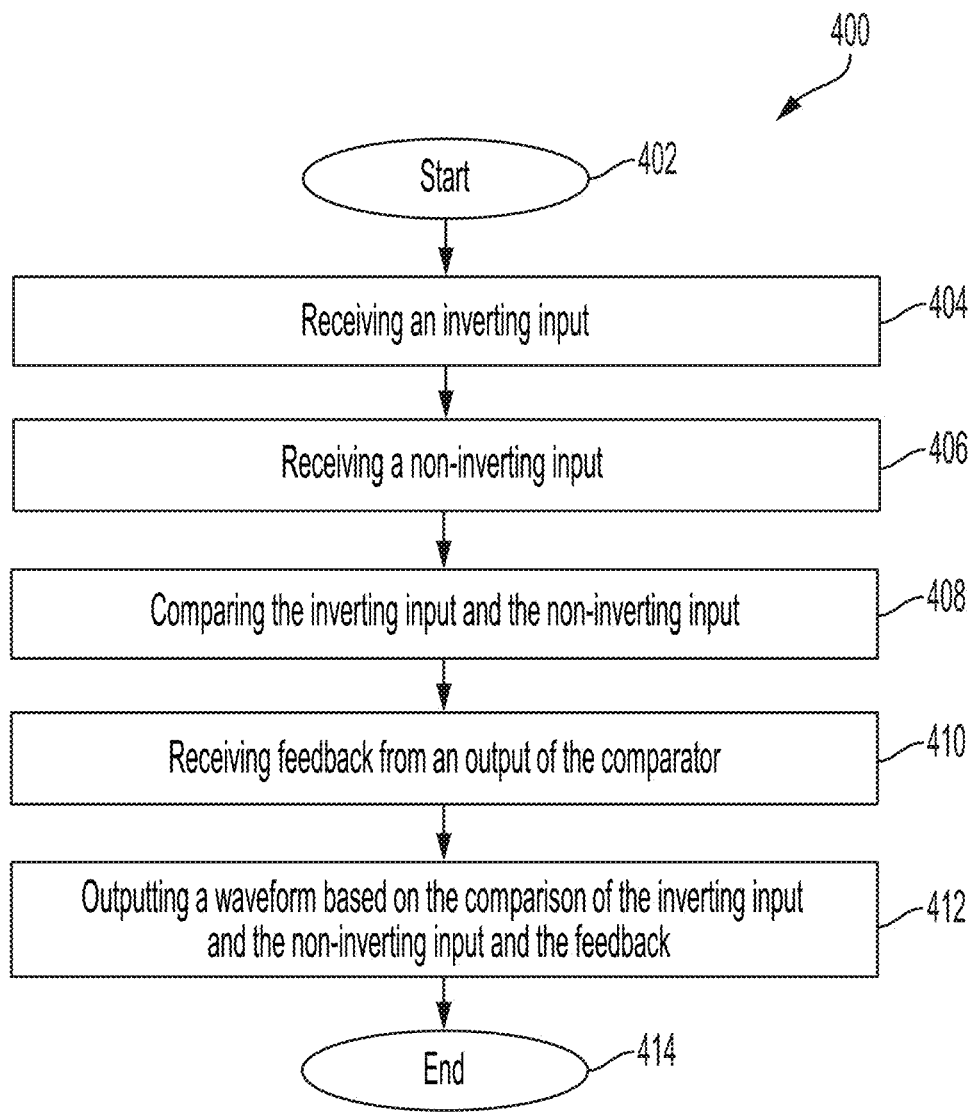
FIG. 4 depicts a flowchart of a method for operating the zero-cross circuit with low phase delay in accordance with one or more embodiments.

FIG. 4 depicts a flowchart of a method 400 for operating the zero-cross circuit with low phase delay in accordance with one or more embodiments. The method 400 can be implemented in the circuit shown in FIG. 1. It should be understood the circuit shown in FIG. 1 is not intended to limit the scope of the disclosure. The method 400 begins at block 402 and proceeds to block 404 which provides for receiving, at a comparator, an inverting input. The inverting input is a reference level signal. Block 406 receives a non-inverting input. The non-inverting input is a signal such as an AC signal. Block 408 compares the inverting input and the non-inverting input to determine an output. Block 410 receives feedback from an output of the comparator. The feedback includes a speed-up capacitor that reduces the phase lag/delay of the hysteresis. Also, the feedback is positive feedback and provided to the non-inverting input of the comparator. Block 412 outputs a waveform based on the comparison of the inverting input and the non-inverting input and the feedback. The output can be provided to a display in a graphical or numerical fashion. The method 400 ends at block 414.

The technical effects and benefits include the reduction of the phase delay due to hysteresis. The low phase delay in the zero-cross circuit enables efficient operation for no break power transfer methods and parallel power systems.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A zero-cross circuit with low phase delay, the circuit comprising:
    a comparator comprises:
        an inverting input operable to receive a reference signal;
        a non-inverting input operable to receive an alternating current (AC) signal; and
    a feedback loop operable to couple an output of the zero-cross circuit to the comparator, wherein the feedback loop comprises a capacitor in series with a resistor, wherein the capacitor reduces a phase delay for the zero-cross circuit, wherein a combination of the capacitor in series with the resistor is in parallel with another resistor.

2. The circuit of claim 1, wherein the feedback loop is coupled to the non-inverting input of the comparator.

3. The circuit of claim 1, wherein the capacitor functions as a "speed-up" capacitor.

4. A method for operating the zero-cross circuit with low phase delay, the method comprising:
    receiving, at a comparator, an inverting input;
    receiving, at the comparator, a non-inverting input;
    comparing, at the comparator, the inverting input and the non-inverting input;
    receiving feedback from an output of the comparator coupled to a feedback loop, wherein the feedback loop comprises a capacitor in series with a resistor, wherein the capacitor reduces a phase delay for the zero-cross circuit, wherein a combination of the capacitor in series with the resistor is in parallel with another resistor; and
    outputting a waveform based on the comparison of the inverting input and the non-inverting input and the feedback.

5. The method of claim 4, wherein the non-inverting input is an AC signal.

6. The method of claim 4, wherein the inverting input is a reference signal.

7. The method of claim 4, further comprising adding a voltage of the capacitor at a zero-cross level of a signal at a positive portion of the signal.

8. The method of claim 7, further comprising removing the voltage of the capacitor at the zero-cross level of the signal at a negative portion of the signal.

9. The method of claim 4, further comprising setting a level of a reference signal at a zero-cross level of a signal.

* * * * *